(12) United States Patent
Schiavone et al.

(10) Patent No.: US 9,224,577 B2
(45) Date of Patent: Dec. 29, 2015

(54) METHOD FOR CORRECTING ELECTRONIC PROXIMITY EFFECTS USING OFF-CENTER SCATTERING FUNCTIONS

(75) Inventors: Patrick Schiavone, Villard-Bonnot (FR); Thiago Figueiro, Grenoble (FR)

(73) Assignees: COMMISSARIAT A L'ENERGIE ATOMIQUE ET AUX ENERGIES ALTERNATIVES, Paris (FR); ASELTA NANOGRAPHICS, Grenoble (FR)

( * ) Notice: Subject to any disclaimer, the term of this patent is extended or adjusted under 35 U.S.C. 154(b) by 57 days.

(21) Appl. No.: 13/587,598

(22) Filed: Aug. 16, 2012

(65) Prior Publication Data
US 2013/0043389 A1 Feb. 21, 2013

(30) Foreign Application Priority Data
Aug. 16, 2011 (FR) ..................... 11 57338

(51) Int. Cl.
| | | |
|---|---|---|
| *H01J 37/31* | (2006.01) | |
| *H01J 37/317* | (2006.01) | |
| *H01J 3/12* | (2006.01) | |
| *G03F 7/20* | (2006.01) | |
| *H01J 37/22* | (2006.01) | |
| *B82Y 10/00* | (2011.01) | |
| *B82Y 40/00* | (2011.01) | |

(52) U.S. Cl.
CPC ............. *H01J 37/3174* (2013.01); *B82Y 10/00* (2013.01); *B82Y 40/00* (2013.01); *G03F 7/2061* (2013.01); *H01J 3/12* (2013.01); *H01J 37/222* (2013.01); *H01J 2229/563* (2013.01); *H01J 2237/226* (2013.01); *H01J 2237/31769* (2013.01)

(58) Field of Classification Search
CPC ....... H01J 37/3174; H01J 3/12; H01J 37/222; H01J 2229/563; H01J 2237/31769; H01J 2237/226; B82Y 40/00; B82Y 10/00; G03F 7/2061
USPC ....................................... 250/492.2; 382/276
See application file for complete search history.

(56) References Cited

U.S. PATENT DOCUMENTS

| | | | | |
|---|---|---|---|---|
| 5,825,040 | A * | 10/1998 | Marrian et al. | 250/492.22 |
| 7,558,709 | B2 * | 7/2009 | Subbarao | 703/2 |
| 2003/0183763 | A1 * | 10/2003 | Bertsche | 250/310 |
| 2005/0273753 | A1 * | 12/2005 | Sezginer | 250/492.22 |

(Continued)

OTHER PUBLICATIONS

Moretti et al. "SWIFT XRT Point Spread Function measured at the Panter end-to-end tests" X Ray and Gamma Ray Instr. for Astr. XVIII, Proc. of SPIE, vol. 5165, pp. 232-240, 2004.*

(Continued)

*Primary Examiner* — Brooke Purinton
(74) *Attorney, Agent, or Firm* — Stroock & Stroock & Lavan LLP (57) ABSTRACT

A method for projecting an electron beam, used notably in direct or indirect writing lithography and in electronic microscopy. Proximity effects created by the forward and backward scattering of the electrons of the beam in interaction with the target must be corrected. For this, the convolution of a point spread function with the geometry of the target is conventionally used. At least one of the components of the point spread function has its maximum value not located on the center of the beam. Preferably, the maximum value is instead located on the backward scattering peak. Advantageously, the point spread function uses gamma distribution laws.

12 Claims, 5 Drawing Sheets

(56) References Cited

U.S. PATENT DOCUMENTS

| | | | |
|---|---|---|---|
| 2006/0186355 A1* | 8/2006 | Smith et al. | 250/492.22 |
| 2008/0067446 A1 | 3/2008 | Belic et al. | |
| 2009/0114837 A1* | 5/2009 | Grella et al. | 250/396 R |
| 2012/0314198 A1* | 12/2012 | Lee et al. | 355/77 |
| 2013/0037714 A1* | 2/2013 | Boughorbel et al. | 250/307 |

OTHER PUBLICATIONS

Butler et al. "Attaining Doppler Precision of 3 m s (-1 1,2)" Pub. of the Astr. Soc. of the Pacific, 108: 500-509, Jun. 1996.*

Steinbring et al. "Characterizing the Adaptive Optics Off-Axis Point Spread Function. II. Methods for use in Laser Guide Star Observations" Pub. of the Astr. Soc. of the Pacific, 117: 847-859, Aug. 2005.*

Anderson, Erik H. et al. "Influence of sub-100 nm scattering on high-energy electron beam lithography", Journal of Vacuum Science and Technology: Part B, AVS / AIP, Melville, New York, vol. 19, No. 6, p. 2506, Figure 7; Nov. 1, 2001.

Intellectual Property Office of France Search Report from French application No. FR1157338, issued Aug. 16, 2011.

* cited by examiner

METHOD FOR CORRECTING ELECTRONIC PROXIMITY EFFECTS USING OFF-CENTER SCATTERING FUNCTIONS

CROSS-REFERENCE TO RELATED APPLICATIONS

This application claims the benefit of French Patent Application No. 11-57338, filed on Aug. 16, 2011, the contents of which are incorporated herein by reference.

BACKGROUND

1. Field of the Invention

The present invention applies notably to the field of electronic lithography for direct etching on a wafer or for fabricating masks. More generally, it applies to any field in which there is a need to model the interaction of an electron beam with a target, which is also the case in electronic microscopy, notably for the inspection of the wafers and of the masks.

2. Description of the Related Art

The interaction of an electron beam with a target is notably affected by a scattering of the electrons around the initial trajectory (forward scattering effect) and by a back-scattering effect. These effects, termed proximity effects, depend notably on the materials of the target and on its geometry. Whatever the reason for wanting to perform this electronic bombardment (etching, imaging or analysis), it is therefore necessary to take account of the proximity effects in order to obtain a result which is true to the desired objective. A correction of the proximity effects is therefore performed. For this, it is known practice to predict them using a model in order to take them into account in calculating the doses of electronic radiation used to bombard the target. For this, it is a known practice to use a so-called scattering or point spread function (PSF) and a convolution of the PSF with the geometry of the target is performed. A PSF that is commonly used is a combination of Gaussians, a first Gaussian to model the forward scattering (PSF of the forward scattering), and one or more additional Gaussians to model the backscattering (PSF of the backscattering).

The PSF equation is thus conventionally represented by a function f(x,y) of the following form:

$$f(\xi) = \frac{1}{\pi(1+\eta)} \left( \frac{1}{\alpha^2} e^{\frac{-\xi^2}{\alpha^2}} + \frac{\eta}{\beta^2} e^{\frac{-\xi^2}{\beta^2}} \right)$$

With the following notations:
α is the width of the direct radiation;
β is the backscattering width;
η is the ratio of the intensities of the direct and backscattered radiations;
ξ is the radial position of a point.

The values of the parameters α, β and η can be determined by trial and error for a given process. These parameters are a function of the acceleration voltage of the machine and of the target. Typically, for an acceleration voltage of the order of 50 KV and a silicon or glass target ($SiO_2$), α is of the order of 30 nm, β of the order of 10 μm and f of the order of 0.5.

The efficiency of this model is, however, not good, notably for the distant effects which are dominated by backscattering. Other PSFs can be used to obtain better efficiencies, notably those of the type suggested by Kamikubo in "Mask Process Correction (MPC) modeling and its application to EUV mask for Electron beam mask writer, EBM-7000", Photomask Technology, Proc. of SPIE, Vol. 7823, 782331, 2010, or the model suggested by Belic in U.S. patent application publication no. 2008/067466. Kamikubo suggests the use of a PSF comprising an exponential function and demonstrates an improvement compared to the Gaussian model. Belic presents a model comprising a linear combination of a number of Gaussian functions, one or more of the coefficients of the linear combination being possibly negative in order to better fit the PSF to physical reality. It has, however, been found that these two variants of the standard functional form of the PSF—the performance of which can be evaluated both by trial and error and by comparison with a model simulating the scattering of the electrons by the Monte-Carlo method (hereinafter in the description termed reference model)—bring improvements that are still insufficient at afar field, notably in applications of the type including mask etching in extreme UV (ultraviolet), said masks generally comprising layers of heavy metals such as tantalum. One of the common features of the PSFs of the prior art is to use centered functions, that is to say, functions for which the maximum amplitude is located where the center of the electronic beam interacts with the target (for the sake of simplicity, this will hereinafter be referred to as at the center of the beam); now, this model is not a good fit with reality, notably in the application scenarios described above in which the proportion of backscattering is significant.

BRIEF SUMMARY

Embodiments of the present invention solve this problem created by the proximity effect modeling deviations by using a class of models in which the PSF does not have a centered peak.

To this end, an embodiment of the invention provides a method for projecting an electronic beam onto a target comprising a step of correcting the effects of forward and backward scattering of said beam, said step comprising a substep of calculating a point spread function, said method being characterized in that said point spread function comprises at least one function the maximum value of which is not located at the center of the beam.

Preferably, said at least one function the maximum value of which is not located on the center of the beam has its maximum value located at the backward scattering peak of the electronic beam.

Preferably, said at least one function the maximum value of which is not located at the center of the beam is a gamma distribution function.

Preferably, said point spread function also comprises a function the maximum value of which is located at the center of the beam in order to model the forward scattering.

Preferably, said point spread function comprises at least as many functions the maximum value of which are not centered at the center of the beam as there are backward scattering peaks, with at least one function the maximum value of which is located at each peak.

Preferably, said point spread function is a linear combination of at least one Gaussian and of at least one gamma function.

To implement the method, an embodiment of the invention also provides a computer program comprising program code instructions for performing the method for projecting an electronic beam according to an embodiment of the invention when the program is run on a computer, said program comprising a module for simulating and/or correcting the effects of forward and backward scattering of said beam, said module comprising a submodule for calculating a point spread function, said program being characterized in that said point spread function comprises at least one function the maximum value of which is not located at the center of the beam.

An embodiment of the invention also covers an electronic lithography system, a system for simulating at least one electronic lithography step, and an electronic microscopy system, each of said systems comprising a module for projecting an electronic beam onto a target and a computer with a computer program according to an embodiment of the invention.

In an embodiment of the invention in which a PSF comprising two gamma distribution functions is used, it has been possible to demonstrate a very significant improvement on the residual root mean square error which is 49% less than that observed with two centered Gaussians and 32% less than that observed with the improvement provided by Kamikubo.

Furthermore, since the classes of function used in this embodiment have an analytical expression, they can be easily incorporated in the market-standard tools with no significant modification. Since the aggregate distribution function is itself analytical, the convolution calculations which are used in the correction of the proximity effects remain of the same order of computational complexity as the prior art solutions.

BRIEF DESCRIPTION OF THE DRAWINGS

The invention will be better understood and its various features and advantages will become apparent from the following description of a number of exemplary embodiments and from its appended figures, of which.

DETAILED DESCRIPTION

Figures 1A, 1B:
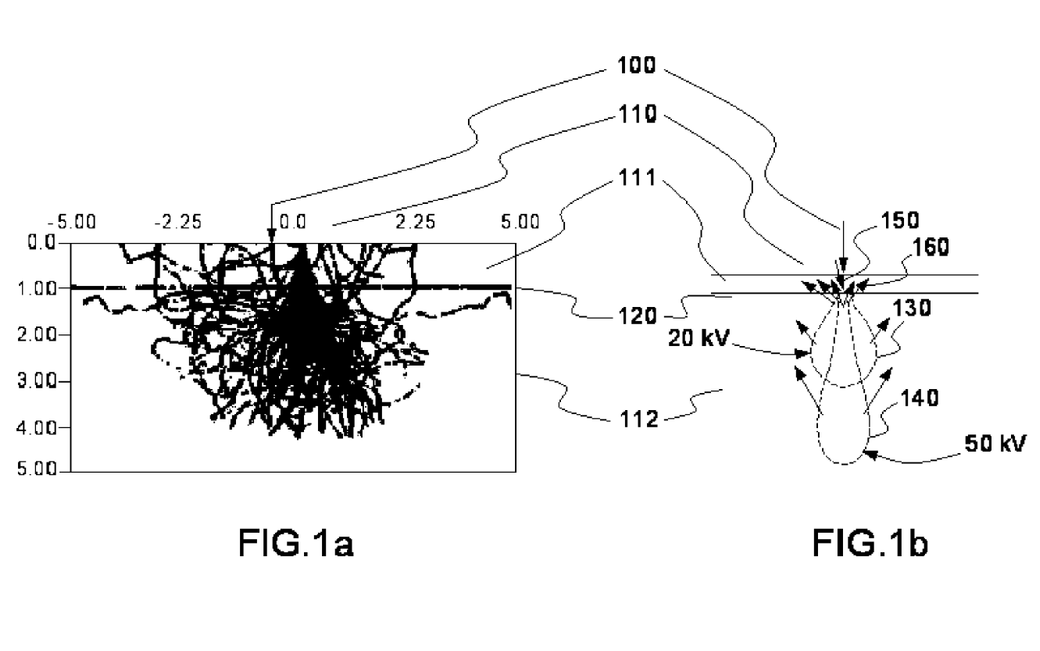
FIGS. 1a and 1b illustrate the effect of backscattering of the electrons.

FIGS. 1a and 1b illustrate the effect of backscattering of the electrons.

FIG. 1a shows a vertical cross section of the trajectories of the electrons of a beam in a target 110 (a layer of resin 111 then in the substrate 112 delimited by the line 120). The random nature of the trajectories, which lends itself well to a modeling by Monte-Carlo simulation, can be observed. However, a simulation of this type is difficult to use in production because it does not allow for direct calculation with parameterized or tabulated functions.

In FIG. 1b, the two scattering effects resulting from the interactions of the electronic beam 100 with the target 110 have been modeled. Two scattering clouds 130, 140 are represented which correspond to acceleration voltages of 20 kV and 50 kV. The forward scattering is represented by the arrow 150 and the backscattering by the arrows 160. As can be seen, the higher the acceleration voltage, the deeper the cloud but the smaller the aperture of this cloud. The backscattered electrons will be ejected on the surface of the target at a greater distance from the point of impact of the center of the beam if the voltage is high.

FIGS. 2a, 2b, 2c and 2d illustrate four models of the energy absorbed by the resin layer of a surface to be etched by an electronic lithography method, respectively according to a reference model, according to a first and a second model of the prior art and according to an embodiment of the invention. These figures take into account only the backscattering phenomena (not the forward scattering). They therefore represent the backscattering PSF.

Figure 2A:
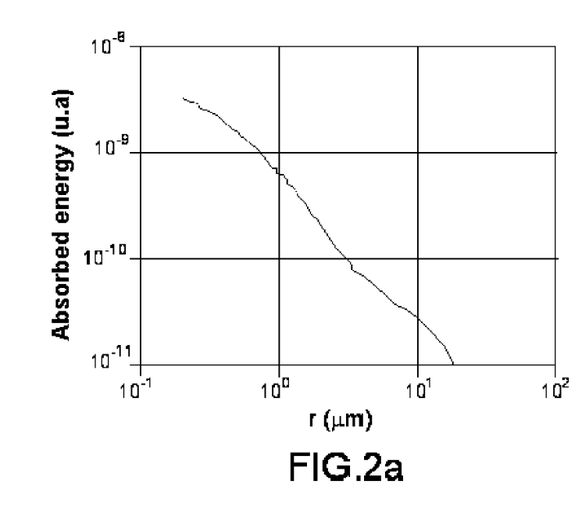
FIGS. 2a, 2b, 2c and 2d illustrate four models of the energy absorbed by a resin layer of a surface to be etched by an electronic lithography method, respectively according to a reference model, according to a first and a second prior art model and according to an embodiment of the invention.

FIG. 2a shows a curve which plots the trend of the absorption of the energy of the electron beam in the layer of resin (in an arbitrary energy unit) as a function of the distance to the center of the beam (in microns), according to a simulation performed by a Monte-Carlo method. The conditions of the experiment are those outlined by the publication by Kamikubo cited above. This curve constitutes the reference model of the measurements for assessing the relevance of the different backscattering PSF models.

Figure 2B:
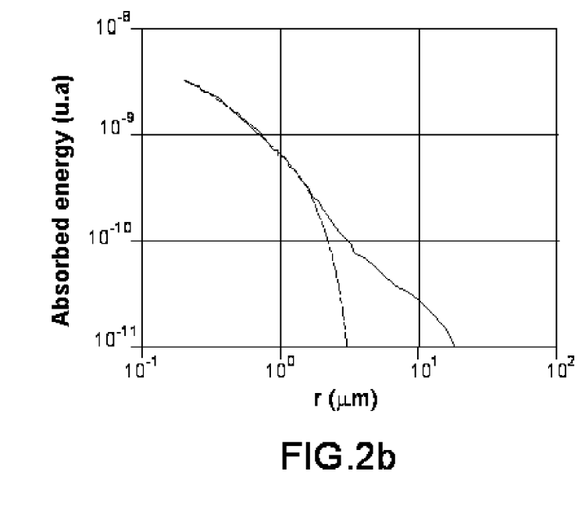

FIG. 2b shows the curve which plots the PSF of the backscattering modeled by a sum of two Gaussian functions.

The two functions used are each centered on the center of the electronic beam. A significant divergence can be observed between the curve of FIG. 2b and the curve of the reference model for distances to the center of the beam greater than a few microns (in the conditions of the Kamikubo experiment).

Figure 2C:
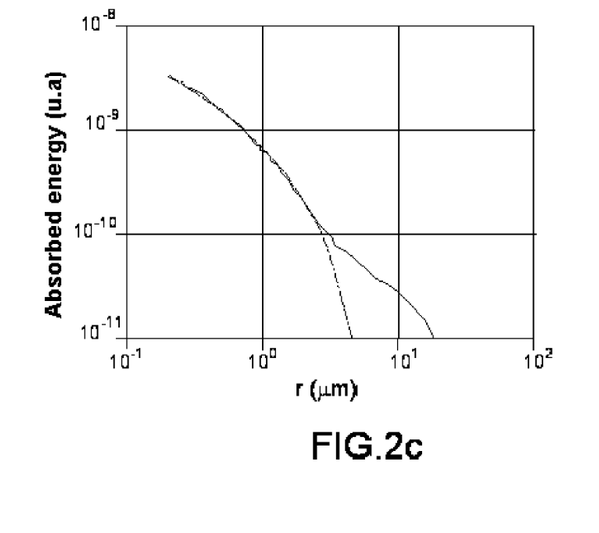

FIG. 2c shows the curve which plots the PSF of the backscattering modeled by the function described by Kamikubo in the publication cited above.

Kamikubo uses exponential functions to model the PSF in the intermediate distances to the center of the beam of less than 1 micron. These functions also show a maximum at the center of the beam. The curve 2b shows that the fit (as this expression is understood by those having ordinary skill in the art) with the reference model is better than in the case of FIG. 2a, but there is still a significant difference for distances to the center of the beam greater than approximately 5 microns (in the conditions of the Kamikubo experiment). An improvement is therefore desirable. This is what is obtained with the embodiment method of the invention.

Figure 2D:
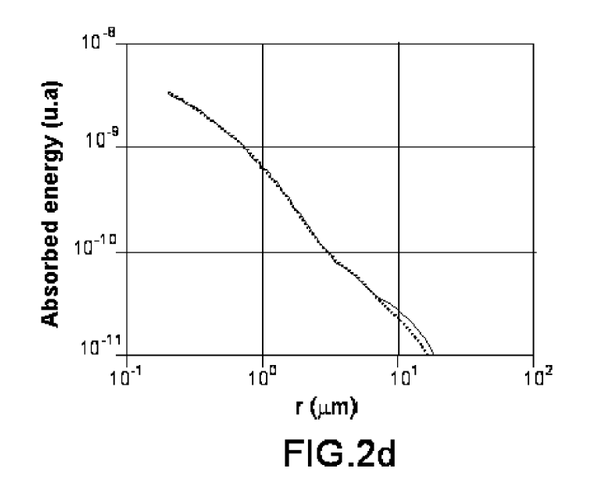

FIG. 2d shows the curve which plots the PSF of the backscattering modeled according to an embodiment method of the invention. This model will be described in detail with reference to FIG. 3. The curve shows that the fit with the reference model is almost perfect, even at significant distances (in the conditions of the Kamikubo experiment), on the order of 10 microns relative to the center of the electronic beam.

The fit is measured by the residual root mean square error. As indicated above, this difference is 49% better than the PSF model of FIG. 2b and 32% better than Kamikubo's PSF model.

To achieve this result, the PSF of the backscattering is modeled by a function (or a combination of functions) that is (are) not centered (that is to say, for which the maximum is not located at the center of the beam but offset relative thereto, without this implying any asymmetry in the function as in the case of a Gaussian). It is simply a bell function whose maximum is offset relative to the center of the beam. Such a function provides for a better appreciation of the fact that the backscattered electrons are "ejected" out of the target at a certain distance from the center of the beam. It is possible to use a lower number of functions than the maxima values of which are not located at the center of the beam, in comparison with the number of functions to be used when they have maxima values located at the center of the beam. It is nevertheless possible to use a greater number of functions according to the invention to further improve the fit. Indeed, it will be possible to use a single function by peak observed on the curve, whereas when Gaussian functions with maxima values are located at each peak, it is necessary to use at least two functions per peak (with negative coefficients for some of them), in order to model each peak. This prior art embodiment according to Bedic increases the computation time needed to optimize the parameters. Moreover, when using functions with maxima value not located at the peaks, the functions may be independent from one another. This is because the larger part of the impact of each function is directed to different locations of the curve and, therefore, the optimization calculations are also simpler.

Figure 3:
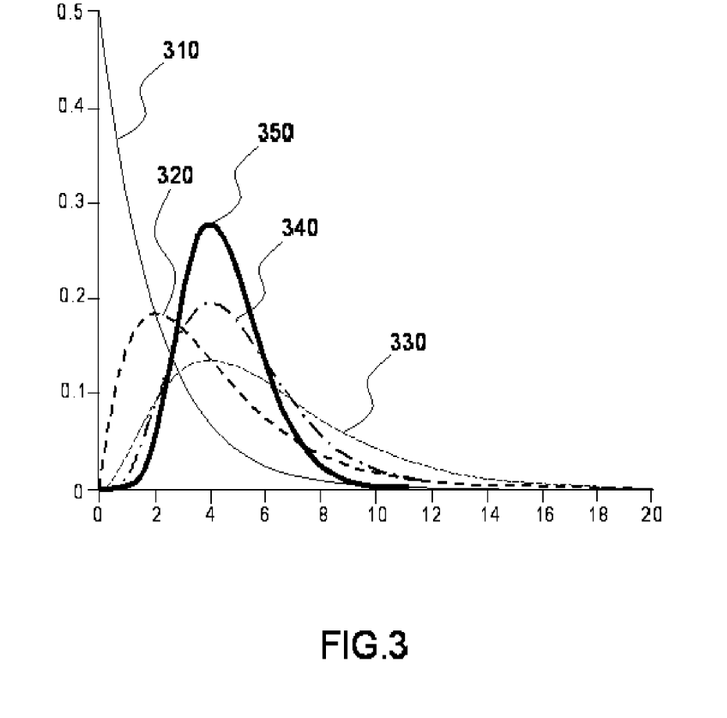
FIG. 3 represents gamma distribution functions used in certain embodiments of the invention, with different parameter values.

FIG. 3 represents gamma distribution functions used in certain embodiments of the invention, with different parameter values.

The function which can advantageously be used to model the PSF of the backscattering is a gamma distribution function with parameters k and θ.

The equation takes the form:

$$f(\xi; k, \theta) = \xi^{k-1} \frac{e^{-\xi/\theta}}{\theta^k \Gamma(k)}$$

In the above expression, ⌈(k) is the value of the gamma function with the parameter k. The mathematical definition of the gamma function is given by the following expression:

$$\Gamma(k) = \lim_{n \to \infty} \frac{n! n^k}{k(k+1)\ldots(k+n)}$$

The values of the parameters k and θ are chosen to optimize the fit with the reference model; these two parameters may impact the symmetry of the curve, the off-centering of the function and the amplitude of its maximum. For example, the distribution peak is situated at the position (k−1)θ. To achieve a choice of the parameters, all optimization methods are possible, and local optimization methods can notably be cited, for example those based on the Levenberg-Marquardt algorithm or the Simplex algorithm or more global optimization methods, for example kriging or methods based on genetic algorithms.

The curves of FIG. 3 represent, as examples, gamma functions for the following values of the parameters k and θ:
k=1; θ=2; (curve 310);
k=2; θ=2; (curve 320);
k=3; θ=2; (curve 330);
k=5; θ=1; (curve 340);
k=9; θ=0.5; (curve 350).

Other values of the parameters k and θ are clearly possible. A number of gamma distribution functions can be combined, for example linearly, to find the best fit.

According to an embodiment of the invention, the gamma distribution functions are chosen in such a way that the resultant distribution is off-center relative to the center of the electronic beam. Preferably, the center of the distribution is adjusted to the backward scattering (backscattering) peak. This choice is particularly advantageous when the backward scattering effect is particularly significant, notably when layers of tantalum or of nitrogen-doped tantalum are implanted on the substrate, as is the case in the extreme UV mask fabrication applications. This is because these layers of heavy materials provoke a very significant backward scattering.

For these applications notably, it is possible to implement the invention by also using Gaussian functions, or functions enhanced by the Kamikubo method, in which the distribution of the backscattering effects is centered not on the center of the electronic beam, but is off-center relative thereto. Advantageously, the centering of the distribution is parameterized to the peak of the backward scattering. It may be found, both by trial and error and by Monte-Carlo simulation, that the peak is off-center relative to the center of the electronic beam. There may be a number of scattering peaks. In this case, a choice will advantageously be made to combine as many functions as there are scattering peaks, with, advantageously, at least one function centered on each peak.

The equation of the PSF may be represented by a function $f(\xi)$ or $f(x,y)$ of the following form:

$$f(\xi) = \frac{1}{\pi(1+\Sigma\eta)} \left( \frac{1}{\alpha^2} e^{\frac{-(r-m)^2}{\alpha^2}} + \Sigma \frac{\eta i}{\beta^2} e^{\frac{-(r-m)^2}{\beta^2}} \right)$$

Where:
α is the width of the direct beam;
β is the width of the backscattering;
$f$ is the ratio of the intensities of the direct and backscattered beams;
or is the radial location of a point;
m is the mean of the peak; if m=0, the maximum value is located at the center of the beam; if m>0, the maximum value is located at m.

Figure 4A:
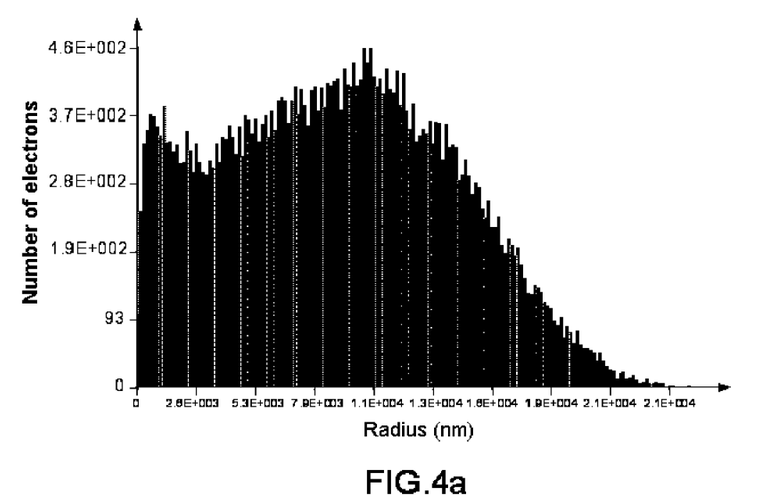
FIGS. 4a and 4b represent the distribution of the number of electrons backscattered on the surface of the target in the case of a mask etching with a glass substrate and, respectively, a Cr and Ta absorber.
Figure 4B:
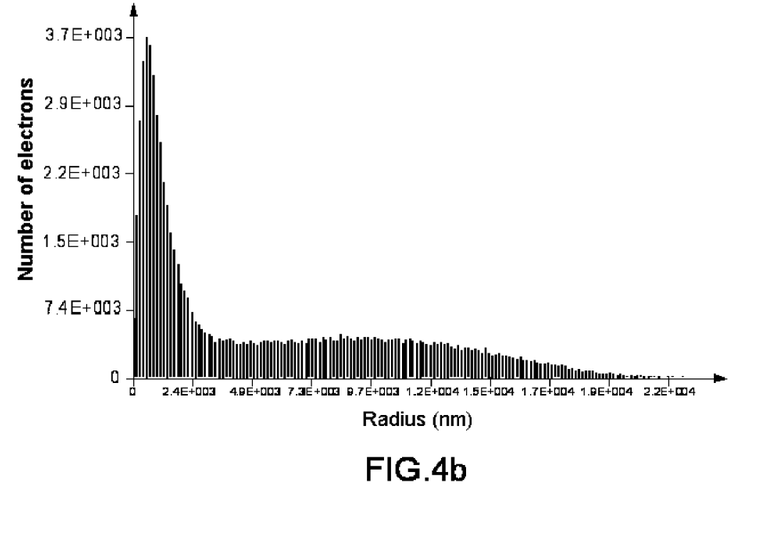

FIGS. 4a and 4b represent the distribution of the number of electrons backscattered on the surface of the target in the case of a mask etching with a glass substrate and, respectively, a Cr and Ta absorber.

Typically, for UV, deep UV or visible lithography, the masks used are transmission mode masks. FIG. 4a gives the number of electrons backscattered to the surface in the case of a standard chrome/glass mask. A main backscattering peak is observed around 10 microns, corresponding to the backscattering in the glass. There is indeed also a peak around one micron corresponding to the backscattering by the chrome absorber but this peak is smaller than the peak at 10 microns and can be disregarded. Thus, a single gamma curve may advantageously be enough to account for the backscattering, centered on the backscattering peak of the substrate, here around 10 microns. Nevertheless, it is possible to use a number of bell curves (Gaussian, gamma, etc.), at least one of which has its maximum value located on this peak.

In extreme UV lithography, the masks operate in reflection mode; they use absorbers with materials heavier than chrome, for example Ta or TaN. The curve of FIG. 4b gives the number of electrons backscattered at the surface in the case of a Ta/glass mask (with the same total number of electrons as for the Cr/glass mask described previously in relation to FIG. 4a). It can be seen that the loss due to the backscattering by the absorber (with its peak around 1 μm) is very large compared to the one due to the backscattering in the substrate (peak around 10 μm). Advantageously, in this case, two gamma curves can be used to model the backscattering, each of said curves being centered on one of these backscattering peaks (that of the substrate and that of the absorber). Nevertheless, it is possible to use a number of bell curves (Gaussian, gamma, etc.), at least one of which has its maximum value located on the backscattering peak in the substrate and another of which has its maximum value located on the backscattering peak in the absorber.

To implement an embodiment of the method of the invention in its applications to electronic lithography by direct projection onto wafers or by mask etching, it is possible to use, for example, a machine of type SB 3054 from the company VISTEC™. The dose modulation can, for example, be done, according to an embodiment of the invention, by modifying dose modulation software, for example the software PROXECCO™ distributed by the company Synopsis™ or the software Inscale™ from the company Aselta Nanographics™ to replace the PSF of the backscattering of the prior art with the PSF of the backscattering described above. For the forward scattering PSF, it will be possible to use, as in the prior art, a centered Gaussian or any other type of bell curve centered on the center of the beam.

The dose modulation is done by convolution of the PSF (PSF of the forward scattering and PSF of the backscattering) with the geometry of the pattern to be etched. The software can also advantageously be modified to produce a combined optimization of the dose modulation and of the geometry of the pattern to be etched, according to a method such as that described in the international application PCT/EP2011/05583 belonging to one of the parties filing the present application, the contents of which are incorporated herein by reference.

The various embodiment methods of the invention and the computer programs for implementing these methods can also be used to optimize the PSF of electronic microscopy systems which can be used in imaging or to perform wafer or mask inspections. They can also be adapted to provide a simulation of one or more steps of an electronic lithography method.

The examples described above are therefore given to illustrate certain embodiments of the invention. They in no way limit the scope of the invention which is defined by the following claims.

What is claimed is:

1. A method for projecting an electron beam onto a target comprising:
    a step of correcting effects of forward and backward scattering of said beam comprising a substep of calculating a point spread function, wherein said point spread function comprises at least one function, a maximum amplitude value of which is not located on a center of the beam; and
    modulating dosage of the electron beam based upon at least the point spread function.

2. The projection method of claim 1, wherein said at least one function, the maximum amplitude value of which is not located on the center of the beam has a respective maximum amplitude value located on a backward scattering peak of the electron beam.

3. The projection method of claim 1, wherein said at least one function the maximum value of which is not located on the center of the beam is a gamma distribution function.

4. The projection method of claim 1, wherein said point spread function further comprises a function a maximum value of which is located on the center of the beam in order to model the forward scattering.

5. The projection method of claim 1, wherein said point spread function comprises at least as many functions respective maximum amplitude values of which are not located on the center of the beam as there are backward scattering peaks, with at least one function a maximum amplitude value of which is respectively located on each backward scattering peak.

6. The projection method of claim 1, wherein said point spread function is a linear combination of at least one Gaussian and of at least one gamma function.

7. A non-transitory computer-readable media comprising program code that is configured to be executable by a computer to provide a module for simulating or correcting effects of forward and backward scattering of an electron beam, said module comprising a submodule for calculating a point spread function, wherein said point spread function comprises at least one function, a maximum amplitude value of which is not located on a center of the electron beam, the point spread function being used for modulation of a dosage of the electron beam.

8. The computer program of claim 7, wherein said point spread function comprises at least one function the maximum amplitude value of which is located on a backward scattering peak of the electron beam.

9. The computer program claim 7, wherein said point spread function comprises at least one Gaussian and at least one gamma function.

10. An electronic lithography system comprising a module for projecting an electron beam onto a target and a computer program according to claim 7.

11. A system for simulating at least one electronic lithography step comprising a module for simulating a step of projecting an electron beam onto a target and a computer program according to claim 7.

12. An electronic microscopy system comprising a module for projecting an electron beam onto a target and a computer according to claim 7.

* * * * *